(12) United States Patent
Chen et al.

(10) Patent No.: US 10,529,711 B2
(45) Date of Patent: Jan. 7, 2020

(54) BURIED CHANNEL SEMICONDUCTOR DEVICE AND METHOD FOR MANUFACTURING THE SAME

(71) Applicant: TAIWAN SEMICONDUCTOR MANUFACTURING CO., LTD., Hsinchu (TW)

(72) Inventors: Chia-Chung Chen, Keelung (TW); Chi-Feng Huang, Hsinchu County (TW); Victor Chiang Liang, Hsinchu (TW); Fu-Huan Tsai, Kaohsiung (TW); Hsieh-Hung Hsieh, Taipei (TW); Tzu-Jin Yeh, Hsinchu (TW); Han-Min Tsai, Hsinchu (TW); Hong-Lin Chu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/684,442

(22) Filed: Aug. 23, 2017

(65) Prior Publication Data
US 2017/0352660 A1  Dec. 7, 2017

Related U.S. Application Data

(62) Division of application No. 14/732,661, filed on Jun. 5, 2015, now Pat. No. 9,761,584.

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823412* (2013.01); *H01L 21/823431* (2013.01);
(Continued)

(58) Field of Classification Search
CPC ........... H01L 21/0273; H01L 21/26513; H01L 29/167; H01L 21/266; H01L 21/823431;
(Continued)

(56) References Cited

U.S. PATENT DOCUMENTS

| 7,910,413 B2 | 3/2011 | Zhu |
| 8,114,746 B2 | 2/2012 | Wei et al. |

(Continued)

FOREIGN PATENT DOCUMENTS

| CN | 102077353 A | 5/2011 |
| KR | 10-2007-0068670 A | 7/2007 |

(Continued)

OTHER PUBLICATIONS

Final Office Action U.S. Appl. No. 14/732,670 dated Nov. 18, 2016.
(Continued)

*Primary Examiner* — William F Kraig
*Assistant Examiner* — Vicki B. Booker
(74) *Attorney, Agent, or Firm* — McDermott Will & Emery LLP

(57) ABSTRACT

A method for manufacturing a semiconductor device includes forming one or more fins extending in a first direction over a substrate. The one or more fins include a first region along the first direction and second regions on both sides of the first region along the first direction. A dopant is implanted in the first region of the fins but not in the second regions. A gate structure overlies the first region of the fins and source/drains are formed on the second regions of the fins.

20 Claims, 14 Drawing Sheets

(51) Int. Cl.
  *H01L 29/167* (2006.01)
  *H01L 29/10* (2006.01)
  *H01L 29/423* (2006.01)
  *H01L 29/417* (2006.01)
  *H03D 7/14* (2006.01)
  *H01L 21/8238* (2006.01)

(52) U.S. Cl.
  CPC ........ *H01L 29/1033* (2013.01); *H01L 29/167* (2013.01); *H01L 29/41783* (2013.01); *H01L 29/42376* (2013.01); *H03D 7/1441* (2013.01); *H03D 7/1458* (2013.01); *H01L 21/823807* (2013.01); *H01L 21/823821* (2013.01)

(58) Field of Classification Search
  CPC ............. H01L 29/1033; H01L 29/0649; H01L 29/42376; H01L 29/41783; H01L 21/823412; H01L 27/0886; H01L 21/823807; H01L 21/823821; H01L 29/66795; H01L 29/785; H01L 29/10; H01L 29/1037; H03D 7/1441; H03D 7/1458
  See application file for complete search history.

(56) References Cited

U.S. PATENT DOCUMENTS

| | | | | |
|---|---|---|---|---|
| 8,164,145 | B2* | 4/2012 | Wirbeleit | H01L 27/11 257/365 |
| 8,604,548 | B2* | 12/2013 | Wang | H01L 21/823821 257/351 |
| 8,980,719 | B2 | 3/2015 | Tsai et al. | |
| 2003/0178670 | A1* | 9/2003 | Fried | H01L 21/28273 257/315 |
| 2006/0197129 | A1 | 9/2006 | Wohlmuth | |
| 2008/0029821 | A1* | 2/2008 | Yamagami | H01L 21/823807 257/365 |
| 2008/0111185 | A1 | 5/2008 | Cheng | |
| 2009/0294800 | A1 | 12/2009 | Cheng et al. | |
| 2009/0321835 | A1 | 12/2009 | Wirbeleit | |
| 2009/0321836 | A1 | 12/2009 | Wei et al. | |
| 2010/0176438 | A1 | 7/2010 | Lue et al. | |
| 2010/0187575 | A1* | 7/2010 | Baumgartner | H01L 21/823431 257/255 |
| 2012/0217467 | A1 | 8/2012 | Tan et al. | |
| 2013/0093026 | A1 | 4/2013 | Wann et al. | |
| 2013/0134485 | A1 | 5/2013 | Fumitake | |
| 2013/0148409 | A1* | 6/2013 | Chung | G11C 17/18 365/148 |
| 2013/0299834 | A1 | 11/2013 | Lee et al. | |
| 2014/0191297 | A1 | 7/2014 | Utomo et al. | |
| 2014/0264446 | A1 | 9/2014 | Basu et al. | |
| 2014/0264575 | A1 | 9/2014 | Tsai et al. | |
| 2015/0263173 | A1 | 9/2015 | Lue | |

FOREIGN PATENT DOCUMENTS

| | | |
|---|---|---|
| KR | 10-2010-0079080 A | 7/2010 |
| KR | 10-2011-0051168 A | 5/2011 |
| KR | 10-2013-0127134 A | 11/2013 |

OTHER PUBLICATIONS

Office Action Taiwanese Patent Application No. 10-2015-0156825 dated Oct. 20, 2016 with English translation.
Non-Final Office Action U.S. Appl. No. 14/732,670 dated May 9, 2016.
Yasuhisa Omura, "Phenomenalistic Reconsideration of Hooge Parameter in Buried-Channel Metal-Oside-Semiconductor Field-Effect Transistors", 2001 IEEE International SOI Conference, Oct. 2001.
Final Office Action issued in related U.S. Appl. No. 14/732,670, dated Apr. 26, 2018.
Non-Final Office Action issued in corresponding U.S. Appl. No. 14/732,670, dated Nov. 3, 2017.

* cited by examiner

BURIED CHANNEL SEMICONDUCTOR DEVICE AND METHOD FOR MANUFACTURING THE SAME

CROSS REFERENCE TO RELATED APPLICATION

This Application is a Divisional Application of U.S. application Ser. No. 14/732,661 filed Jun. 5, 2015, now U.S. Pat. No. 9,761,584, the subject matter of which is incorporated herein by reference in entirety.

This application discloses subject matter similar to that disclosed in U.S. application Ser. No. 14/732,670, filed Jun. 5, 2015. U.S. application Ser. No. 14/732,670 is incorporated by reference in this application in its entirety.

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). FinFET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the FinFET utilizing, for example, silicon germanium (SiGe), silicon phosphide (SiP) or silicon carbide (SiC), may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

FinFET devices have a larger flicker noise than bulk CMOS devices. Analog/RF circuits require lower noise and higher linearity MOS devices. The present disclosure is directed to a transistor providing lower noise and higher linearity MOS devices.

Examples of devices that can benefit from one or more embodiments of the present disclosure are semiconductor devices. Such a device, for example, is a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. In particular, a Gilbert-cell mixer can benefit from the present disclosure. The following disclosure will include a FinFET example to illustrate various embodiments of the present application. It is understood, however, that the application should not be limited to a particular type of device, except as specifically claimed.

Figure 1:
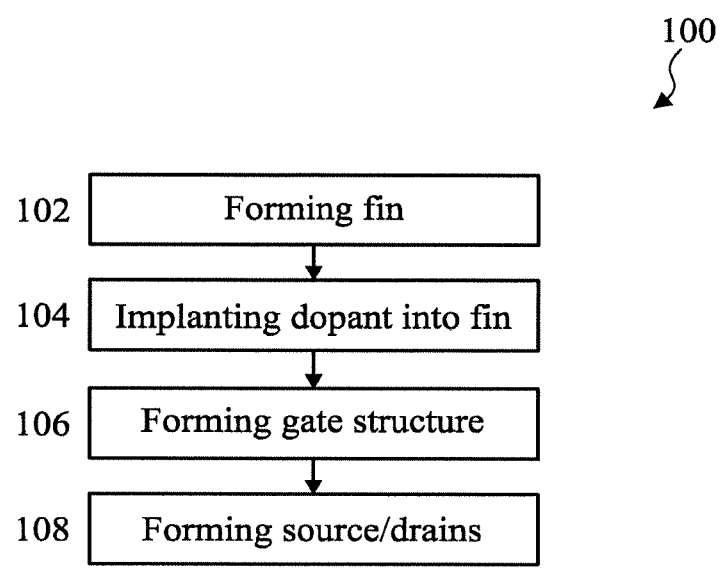
FIG. 1 is an exemplary process flow chart for manufacturing a semiconductor FET device having a fin structure (FinFET) according to an embodiment of the present disclosure.

An exemplary method for manufacturing a semiconductor FET device having a fin structure (FinFET) according to an embodiment of the present disclosure is illustrated in FIG. 1. An exemplary method 100 includes an operation 102 of forming a one or more fins over a substrate and an operation 104 of implanting a dopant into the one or more fins. An operation 106 of forming a gate structure over the one or more fins is performed after the implanting operation. Source/drains are formed on the one or more fins on either side of the gate structure in an operation 108.

Figure 2:
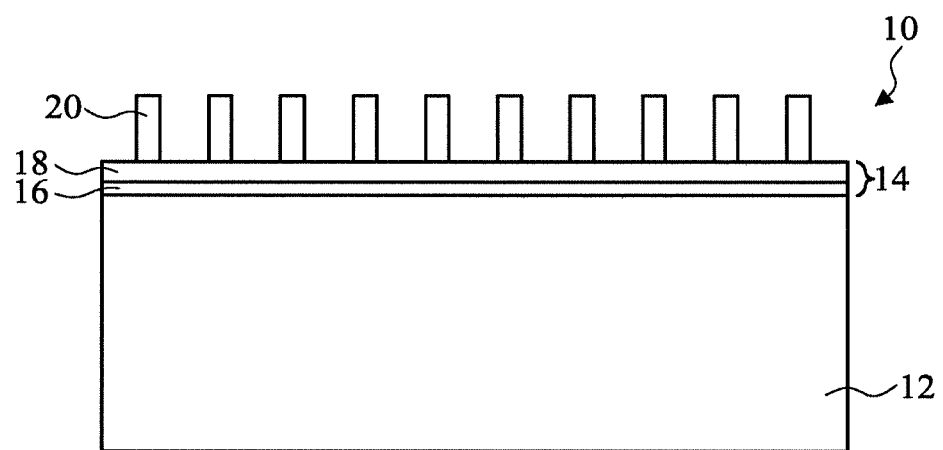
FIGS. 2-16 show an exemplary method for manufacturing a semiconductor device and a semiconductor device in accordance with an embodiment of the disclosure.

To fabricate one or more fins according to one embodiment, a mask layer 14 is formed over a substrate 12, as illustrated in FIG. 2. The mask layer 14 is formed by, for example, a thermal oxidation process and/or a chemical vapor deposition (CVD) process. The substrate 12 is, for example, a p-type silicon substrate with an impurity concentration in a range of about $1 \times 10^{15}$ cm$^{-3}$ to about $2 \times 10^{15}$ atoms cm$^{-3}$. In other embodiments, the substrate 12 is an n-type silicon substrate with an impurity concentration in a range of about $1 \times 10^{15}$ cm$^{-3}$ to about $2 \times 10^{15}$ atoms cm$^{-3}$. The mask layer 14 includes, for example, a pad oxide (e.g., silicon oxide) layer 16 and a silicon nitride mask layer 18 in some embodiments.

Alternatively, the substrate 12 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 12 is a silicon layer of an SOI (silicon-on insulator) substrate. When an SOI substrate is used, the fins may protrude from the silicon layer of the SOI substrate or may protrude from the insulator layer of the SOI substrate. In the latter case, the silicon layer of the SOI substrate is used to form the fins. Amorphous substrates, such as amorphous Si or amorphous SiC, or insulating material, such as silicon oxide may also be used as the substrate 12. The substrate 12 may include various regions that have been suitably doped with impurities (e.g., p-type or n-type conductivity).

The pad oxide layer 16 may be formed by using thermal oxidation or a CVD process. The silicon nitride mask layer 18 may be formed by a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), a physical vapor deposition (PVD), such as a sputtering method, and/or other processes.

The thickness of the pad oxide layer 16 is in a range of about 2 nm to about 15 nm and the thickness of the silicon nitride mask layer 18 is in a range of about 2 nm to about 50 nm in some embodiments. A mask pattern 20 is further formed over the mask layer 14. The mask pattern 20 is, for example, a resist pattern formed by lithography operations.

By using the mask pattern 20 as an etching mask, a hard mask pattern of the pad oxide layer 16 and the silicon nitride mask layer 18 is formed. The width of the hard mask pattern is in a range of about 5 nm to about 40 nm in some embodiments. In certain embodiments, the width of the hard mask patterns is in a range of about 7 nm to about 12 nm.

Figure 3:
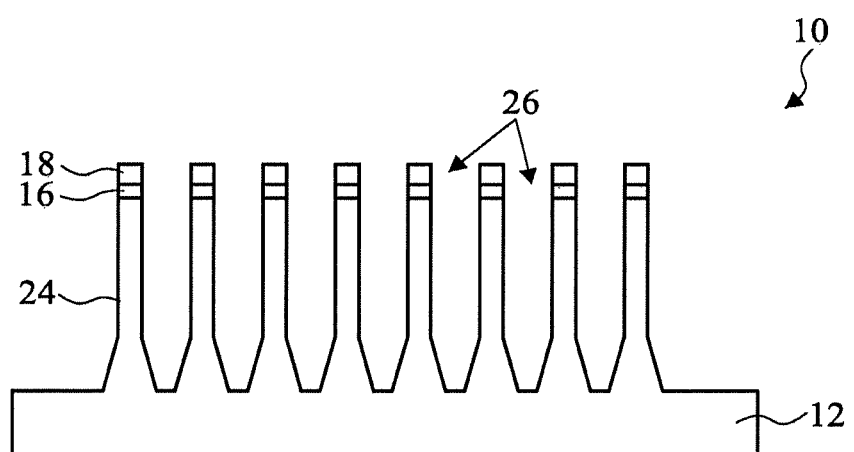

By using the hard mask pattern as an etching mask, the substrate 12 is patterned into a plurality of fins 24, as shown in FIG. 3, by trench etching using a dry etching method and/or a wet etching method to form trenches 26. A height of the fins 24 is in a range of about 20 nm to about 300 nm. In certain embodiments, the height is in a range of about 30 nm to about 60 nm. When the heights of the fins 24 are not uniform, the height from the substrate may be measured from the plane that corresponds to the average heights of the fins 24. The width of each of the fins 24 is in a range of about 7 nm to about 15 nm.

In this embodiment, a bulk silicon wafer is used as the substrate 12. However, in some embodiments, other types of substrate may be used as the substrate 12. For example, a silicon-on-insulator (SOI) wafer may be used as a starting material, and the insulator layer of the SOI wafer constitutes the substrate 12 and the silicon layer of the SOI wafer is used for the fins 24.

As shown in FIG. 3, eight fins 24 are disposed over the substrate 12. However, the number of fins is not limited to eight. There may be as few as one fin and more than eight fins. In addition, one or more dummy fins may be disposed adjacent to the sides of the fins to improve pattern fidelity in the patterning processes. The width of each fin 24 is in a range of about 5 nm to about 40 nm in some embodiments, and may be in a range of about 7 nm to about 15 nm in certain embodiments. The width of trenches 26 between adjacent fins is in a range of about 5 nm to about 80 nm in some embodiments, and may be in a range of about 7 nm to about 15 nm in other embodiments. One skilled in the art will realize, however, that the dimensions and values recited throughout the descriptions are merely exemplary, and may be changed to suit different scales of integrated circuits.

In certain embodiments, the FinFET device is a P-type FinFET, while in other embodiments, the device is an N-type FinFET, depending on the dopant types used in the source/drains and channel.

Figure 4:
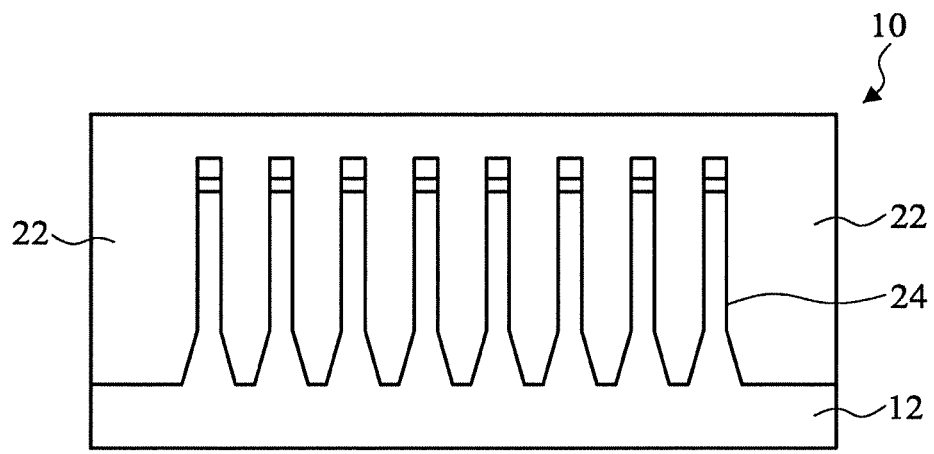

After forming the fins 24, an isolation insulating layer 22 is formed in trenches 26 between the fins 24 and overlying the fins 24, so that the fins 24 are buried in isolation insulating layer 22, as illustrated in FIG. 4. The isolation insulating layer 22 is also referred to as a shallow trench insulation (STI).

The isolation insulating layer 22 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layer 22 may be formed by one or more layers of SOG, SiO, SiON, SiOCN and/or fluoride-doped silicate glass (FSG) in some embodiments.

Figure 5:
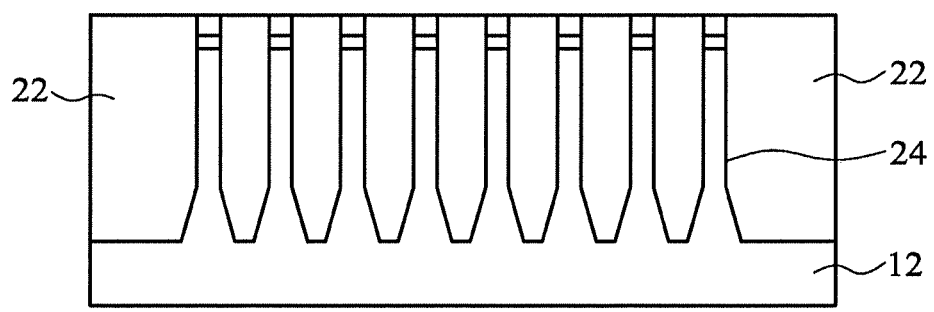

A planarization operation is performed so as to remove part of the isolation insulating layer 22. As illustrated in FIG. 5, the planarization operation may include a chemical mechanical polishing (CMP) and/or an etch-back process.

Figure 6:
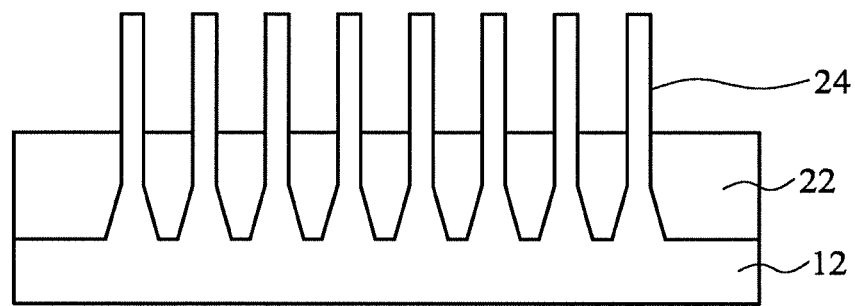

The mask layer 14 may be removed, and an upper portion of the isolation insulating layer 22 is further removed so that the channel region (upper portion) of the fins 24 is exposed, as shown in FIG. 6.

In certain embodiments, removal of the mask layer 14 and partially removing the isolation insulating layer 22 may be performed using a suitable etching process. For example, the mask layer 14 may be removed by a wet etching process, such as, by dipping the substrate in hydrofluoric acid (HF) or phosphoric acid ($H_3PO_4$). On the other hand, the partially removing the isolation insulating layer 22 may be performed using a dry etching process. For example, a dry etching process using $CHF_3$ or $BF_3$ as etching gases may be used.

Figure 7:
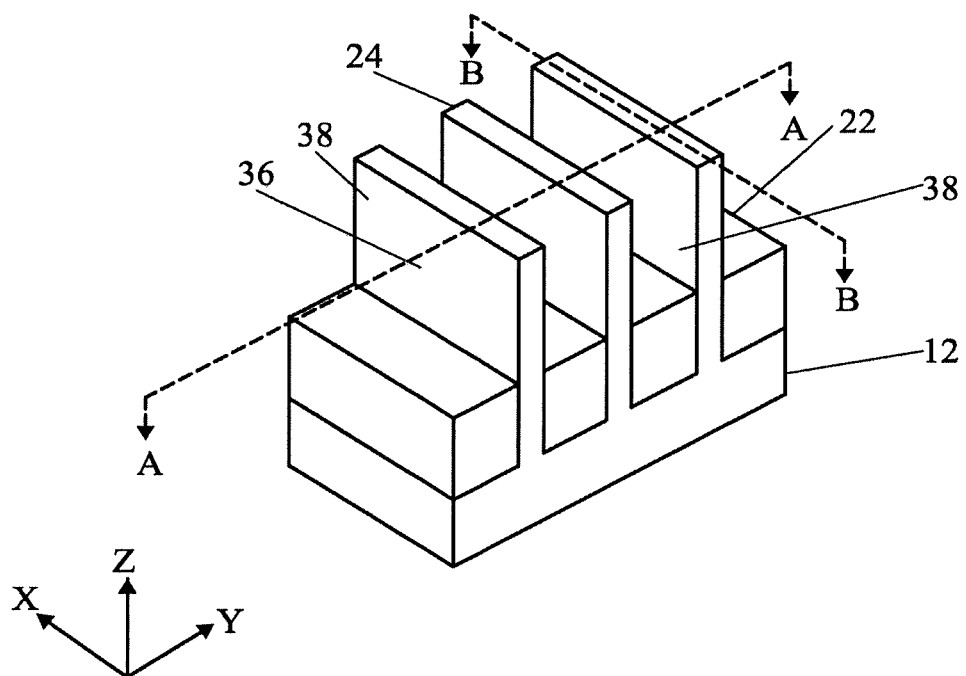

An isometric view of the device 10 showing the fins 24 exposed from the isolation insulating layer 22 is depicted in FIG. 7. To simplify the disclosure, only three fins are shown in FIG. 7. The exposed portions of the fins 24 comprise two regions. A first region 36 in a central portion of the fin 24 is where a gate structure will be formed, and a second region 38 at the peripheral portions of the fin 24 is where source/drain regions will be formed.

Figure 8:
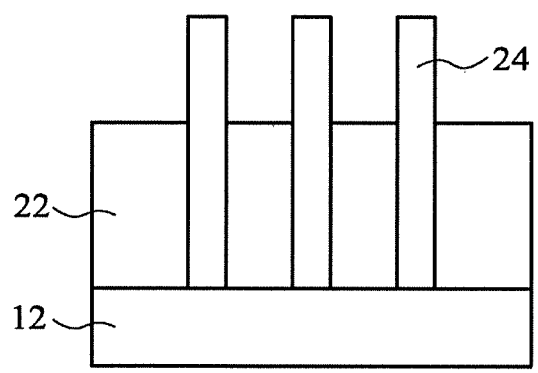
Figure 9A:
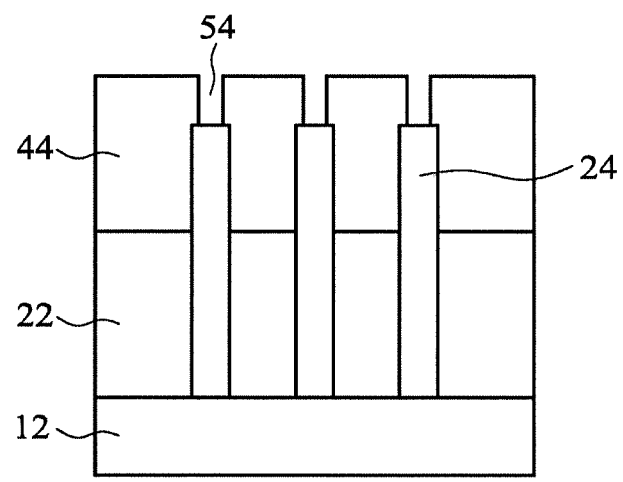
Figure 9B:
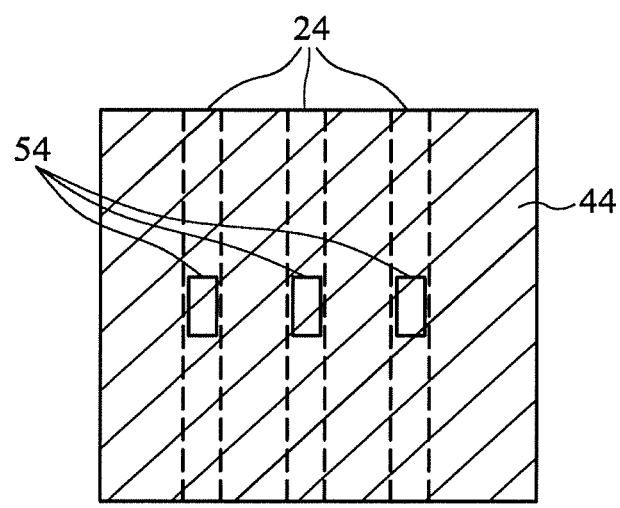

FIG. 8 depicts a cross section taken along line A-A of FIG. 7. A resist layer 44, such as a photoresist, is formed over the fins 24, as shown in FIG. 9A. The resist layer 44 is patterned by exposure to actinic radiation and subsequent development to form openings 54 exposing the top of the fins 24. The openings 54 are formed over the first regions 36 of the fins 24 and the second regions 38 of the fins 24 are covered by the resist 44. A plan view of the resist layer 44 with openings 54 is shown in FIG. 9B.

Figure 10:
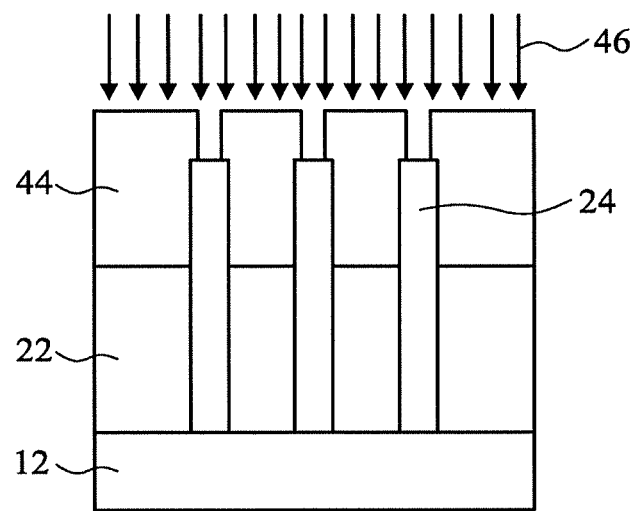

Using the patterned resist layer 44, as a mask, a dopant 46 is implanted into the fins 24 by ion implantation, as shown in FIG. 10. The fins 24 are masked so that the dopant is implanted into the first region 36 of the fin, which will become the channel of the FinFET. In certain embodiments, the dopant is implanted at an energy ranging from about 1 KeV to about 100 KeV.

Figure 11:
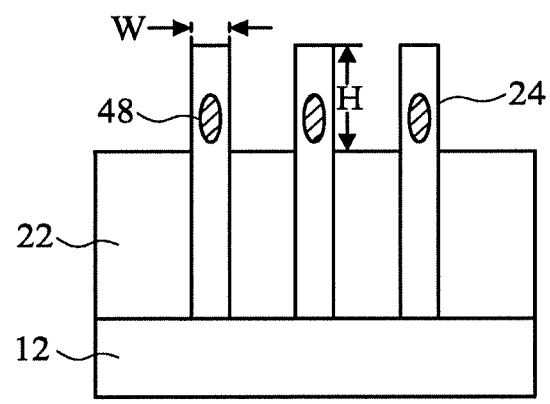

In certain embodiments, the dopant 46 is an N-type dopant selected from the group consisting of P, As, and Sb. In particular, the N-type dopant may be P in certain embodiments. In other embodiments, the dopant 46 is a P-type dopant selected from the group consisting of B, $BF_2$, Al, and Ga. The concentration of the dopant 46 implanted in the first region 36 is about $1.5 \times 10^{16}$ to $2.0 \times 10^{20}$ atoms $cm^{-3}$. In certain embodiments, the concentration of the dopant 46 in the first region 36 is about $1.7 \times 10^{17}$ to $1.7 \times 10^{19}$ atoms $cm^{-3}$. The concentration of the dopant 46 in the first region 36 is about $1 \times 10^{18}$ to $2 \times 10^{18}$ atoms $cm^{-3}$ in certain embodiments. As shown in FIG. 11, the implanted dopant 46 may form a doped region 48 centered at region in the fin located at about 15 to 20 nm in the height H direction from a top of the fin 24 and 3 to 7 nm in a fin thickness direction W from a sidewall of the fin 24. The doped region 48 forms a buried channel.

Figure 12:
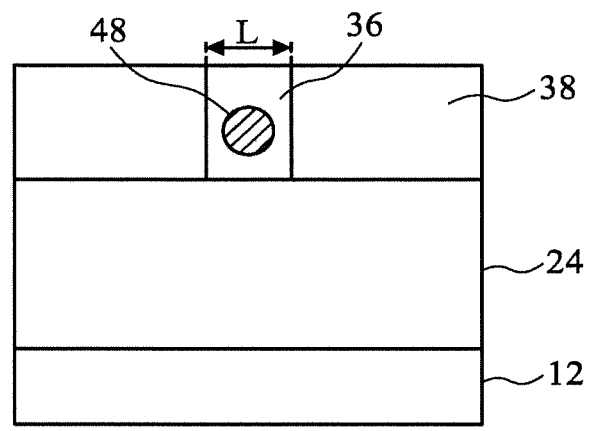

Adverting to FIG. 12, which is a view corresponding to a cross section along line B-B in FIG. 7, illustrating a buried channel doped region 48. A gate electrode structure will subsequently be formed overlying the buried channel doped region 48, and source/drain regions will be formed overlying second regions 38 on sides of the first region 36. The channel length L corresponds to the length of the first region 36. The channel length L may range from about 7 nm to about 16 nm in some embodiments. The channel length L also corresponds to the gate length of the subsequently formed transistor.

Figure 13:
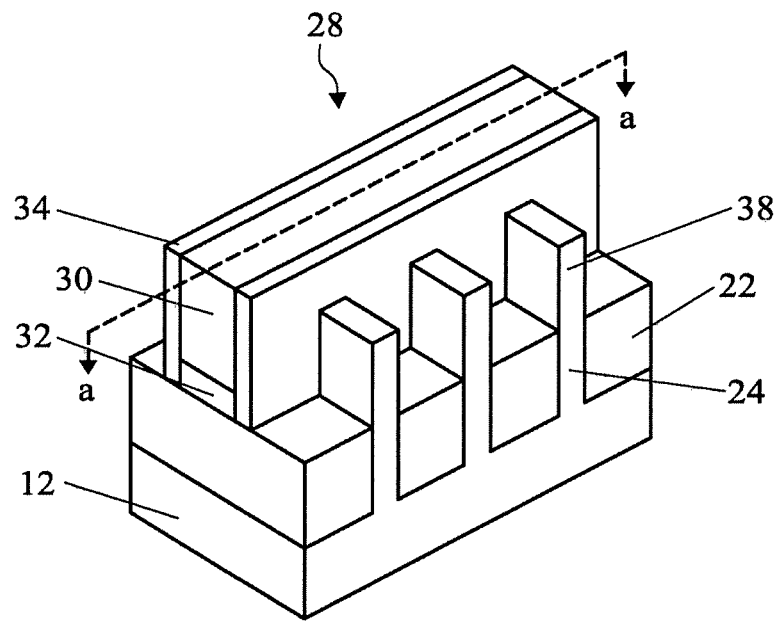
Figure 14:
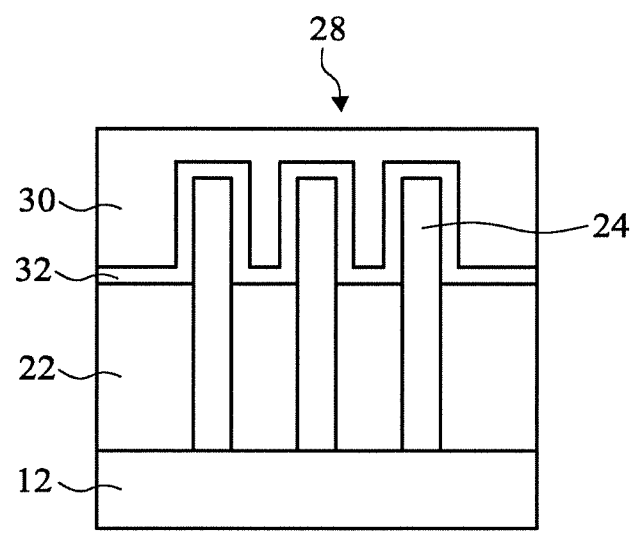

A gate structure 28 is subsequently formed over the first region 36 of the fins, as shown in FIG. 13. The gate structure formation process may include the operations of depositing a gate dielectric 32, depositing a gate electrode 30, patterning the gate electrode, lightly doped drain (LDD) implantation, and annealing. Sidewall spacers 34 are subsequently formed on the gate structure 28, and source/drain implantation and annealing are performed. FIG. 14 corresponds to a cross section taken along line a-a of FIG. 13, showing the arrangement of the fins 24 and the gate electrode structure 28.

In certain embodiments, the FinFET can be fabricated using a gate first method or a gate last method. In embodiments using a high-k dielectric and a metal gate (HK/MG), a gate last method is employed to form the gate electrode. In the gate last method, a dummy gate is formed, the dummy gate is subsequently removed at a later operation after a high temperature annealing operation, and the high k dielectric and a metal gate (HK/MG) is formed.

According to embodiments of the disclosure, the high k gate dielectric 32 may comprise $HfO_2$, HfSiO, HfSiON, HfTaO, HfTiO, HfZrO, zirconium oxide, aluminum oxide, hafnium dioxide-alumina ($HfO_2$— $Al_2O_3$) alloy, other suitable high-k dielectric materials, or combinations thereof.

The metal gate material may comprise one or more layers of Ti, TiN, titanium-aluminum alloy, Al, AlN, Ta, TaN, TaC, TaCN, TaSi, and the like.

The gate dielectric 32 may comprise one or more layers of silicon oxide, silicon nitride, silicon oxynitride, high-k dielectric material, other suitable dielectric material, and/or combinations thereof. The gate electrode 30 in certain embodiments is formed of polysilicon and may include a hard mask formed over the gate electrode. The hard mask may be made a suitable hard mask material, including $SiO_2$, SiN, or SiCN. In some embodiments, a thickness of the gate dielectric layer is in a range of about 5 nm to about 20 nm, and in a range of about 5 nm to about 10 nm in other embodiments. The gate electrode structure may comprise additional layers such as interfacial layers, capping layers, diffusion/barrier layers, dielectric layers, conductive layers, and other suitable layers, and combinations thereof. In addition to polysilicon, in some embodiments, the gate electrode 30 includes one or more layers of any other suitable material, such as aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof. In some embodiments, a thickness of the gate electrode layer is in a range of about 50 nm to about 400 nm, and may be in a range of about 100 nm to 200 nm.

In some embodiments, the sidewall spacers 34 are used to offset subsequently formed doped regions, such as source/drain regions. The sidewall spacers 34 may further be used for designing or modifying the source/drain region (junction) profile. The sidewall spacers 34 may be formed by suitable deposition and etch techniques, and may comprise silicon nitride, silicon carbide, silicon oxynitride, other suitable materials, or combinations thereof.

A blanket layer of a side-wall insulating material may be formed by CVD, PVD, ALD, or other suitable technique. Then, an anisotropic etching is performed on the side-wall insulating material to form a pair of side-wall insulating layers (spacers) 34 on two main sides of the gate structure. The thickness of the side-wall insulating layers 34 is in a range of about 5 nm to about 30 nm in some embodiments, and in a range of about 10 nm to about 20 nm in other embodiments. As shown in FIG. 13, the side wall insulating layer may not be formed over the regions of the fin that is to become the source and drain.

Figure 15:
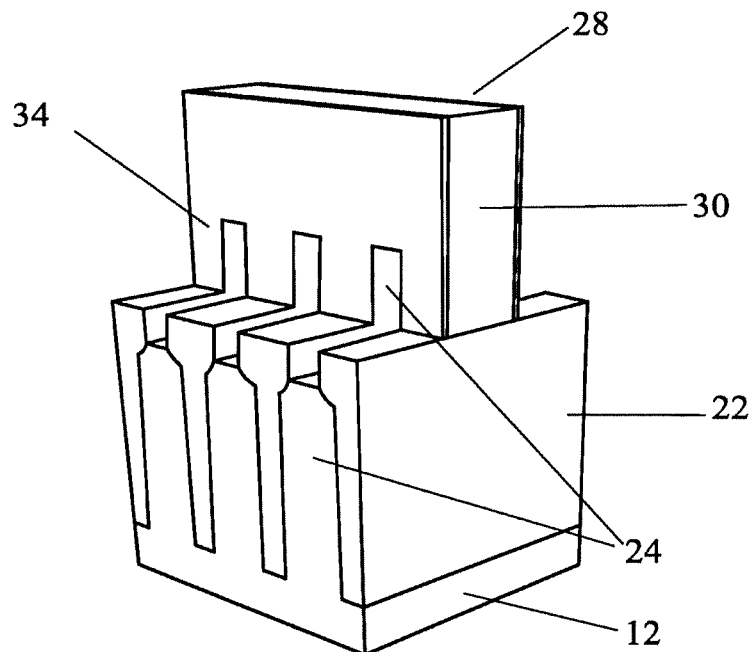

The second region 38 of the fins not covered with the gate structure 28 are subsequently etched to remove the portion of the fins above the STI region 22, as shown in FIG. 15. Suitable photolithographic and etching techniques can be used to remove the second region 38 of the fins.

Figure 16:
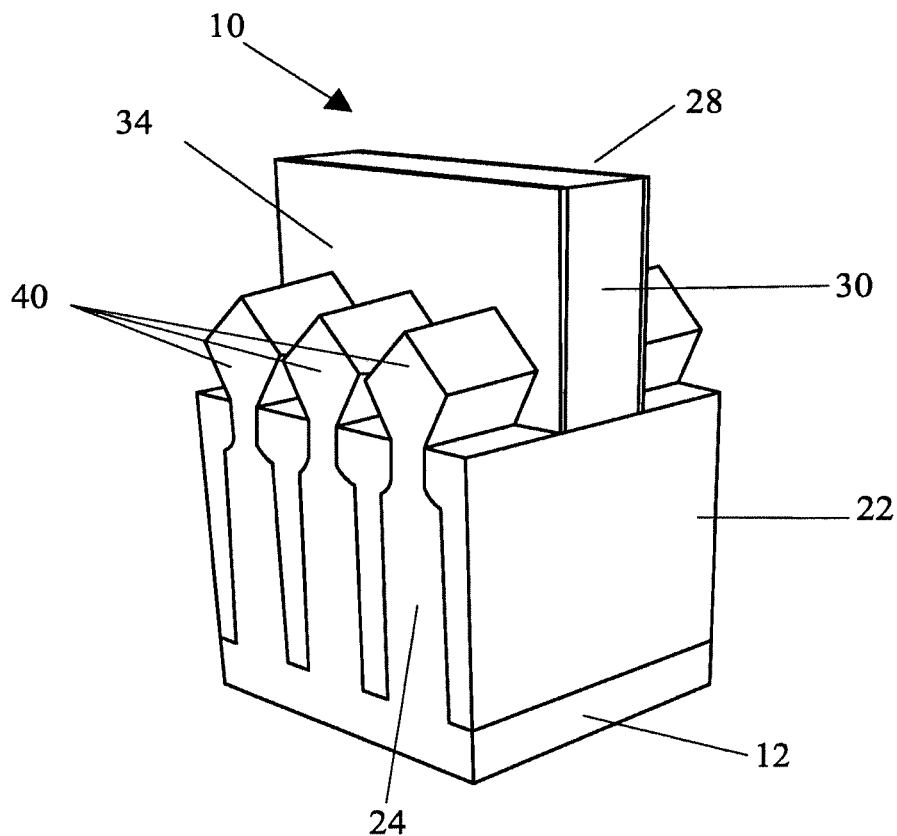

In certain embodiments, raised source/drain regions 40 are subsequently formed overlying the etched portion of the fins 24, as shown in FIG. 16, providing a FinFET semiconductor device 10. The raised source/drain regions may be formed by one or more epitaxy or epitaxial (epi) processes, such that Si features, SiC features, SiGe features, SiP features, SiCP features, or Group III-V semiconductor material on Si EPI or other suitable features are formed in a crystalline state on the fins. The epitaxy processes include CVD deposition techniques (e.g., vapor-phase epitaxy (VPE) and/or ultra-high vacuum CVD (UHV-CVD)), molecular beam epitaxy, and/or other suitable processes.

In some embodiments of the disclosure, source/drain electrodes are formed contacting the respective source/drain regions. The electrodes may be formed of a suitable conductive material, such as copper, tungsten, nickel, titanium, or the like. In some embodiments, a metal silicide is formed at the conductive material and source/drain interface to improve conductivity at the interface. In one example, a damascene and/or dual damascene process is used to form copper-based multilayer interconnection structures. In another embodiment, tungsten is used to form tungsten plugs.

Subsequent processing according to embodiments of the disclosure may also form various contacts/vias/lines and multilayer interconnects features (e.g., metal layers and interlayer dielectrics) on the semiconductor substrate, configured to connect the various features or structures of the FinFET device. For example, a multilayer interconnection includes vertical interconnects, such as conventional vias or contacts, and horizontal interconnects, such as metal lines.

In certain embodiments, the epitaxial growth of the source/drain regions is continued until the individual source/drain regions merge together to form a FinFET semiconductor device with merged source/drain regions.

Figure 17:
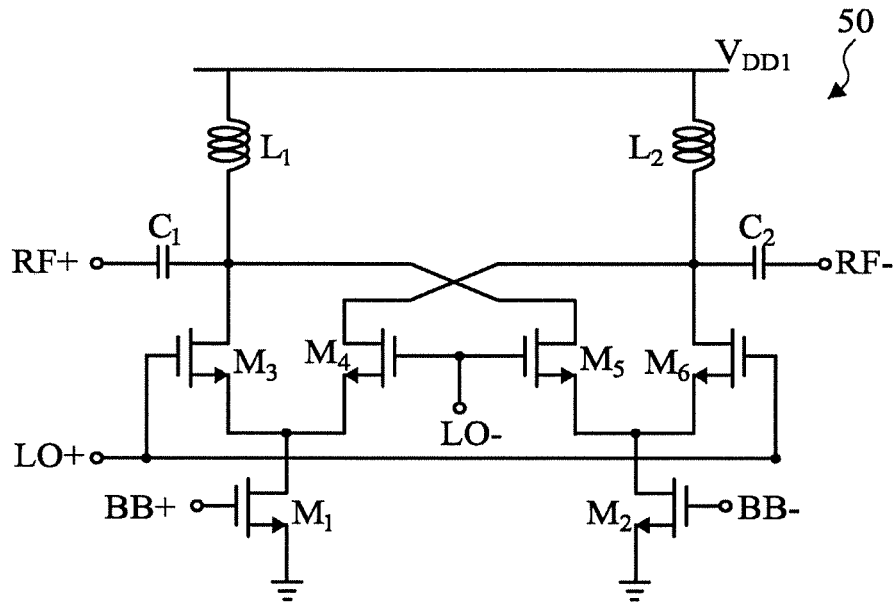
FIG. 17 shows a mixer circuit according to an embodiment of the disclosure.

In another embodiment of the present disclosure, a semiconductor device, such as a Gilbert-cell mixer 50, is provided, as illustrated in FIG. 17. The Gilbert-cell mixer includes a plurality of transistors $M_1$, $M_2$, $M_3$, $M_4$, $M_5$, $M_6$ electrically connected to each other. At least one of the transistors includes a buried-channel FinFET according to the embodiment previously disclosed herein. The Gilbert-cell mixer 50 further includes inductors $L_1$, $L_2$ and capacitors $C_1$, $C_2$, as shown in FIG. 17.

In an embodiment of a Gilbert-cell mixer according to the present disclosure, as shown in FIG. 17A, the right-hand side of the circuit diagram is a mirror image of the left-hand side. Inductors L1 and L2 are connected to transistors M3 and M6, respectively. Capacitor C1 is connected between inductor L1 and transistor M3, and is connected to transistor M5. Capacitor C2 is connected between inductor L2 and transistor M6, and is connected to transistor M4. The current outputs of transistors M3 and M4 are connected to transistor M1, the current output of which is connected to ground. The current outputs of transistors M5 and M6 are connected to transistor M2, the current output of which is connected to ground. In certain embodiments, each of transistors M1, M2, M3, M4, M5, M6 can be a buried-channel FinFET transistor.

Figure 18:
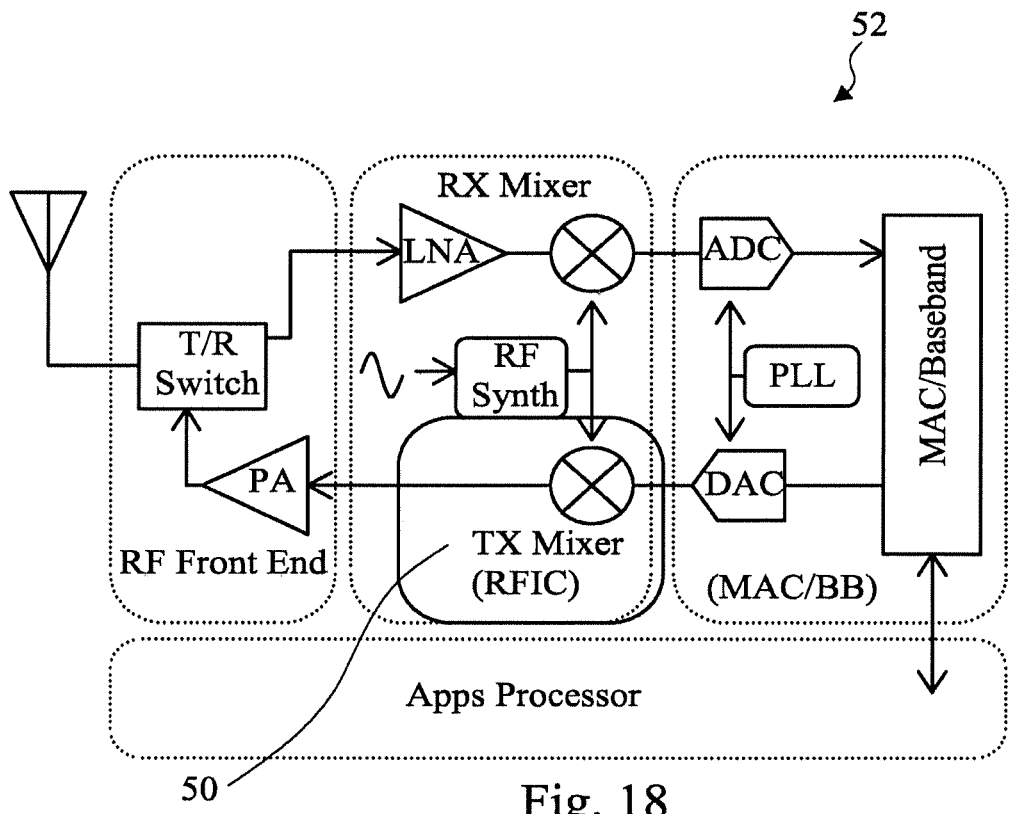
FIG. 18 shows an apparatus including a mixer circuit according to an embodiment of the disclosure.
Figure 19A:
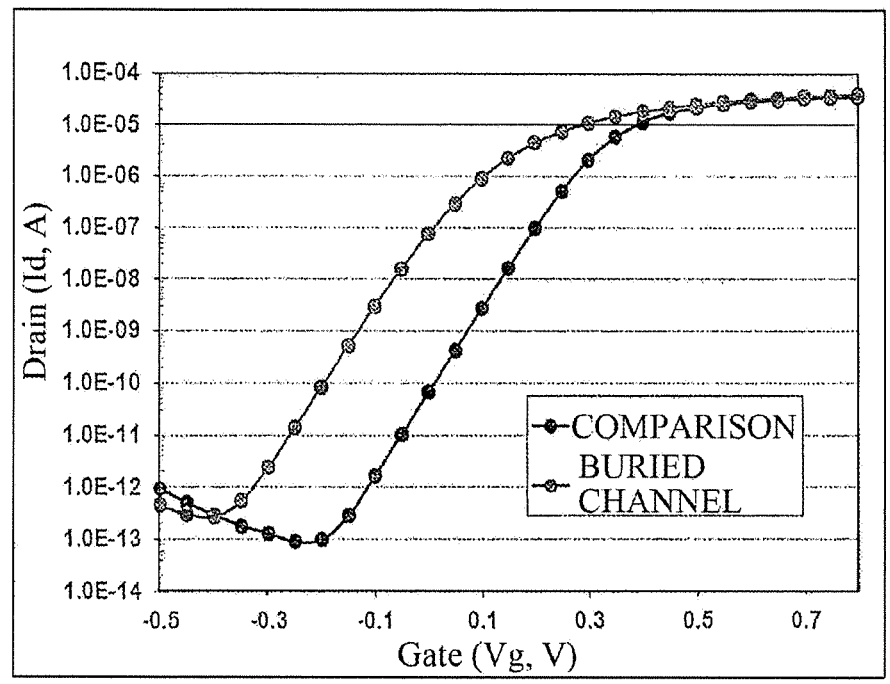
FIGS. 19A-19D are graphs illustrating the gate voltage versus the drain current of a device including a FinFET according to the disclosure.
Figure 19B:
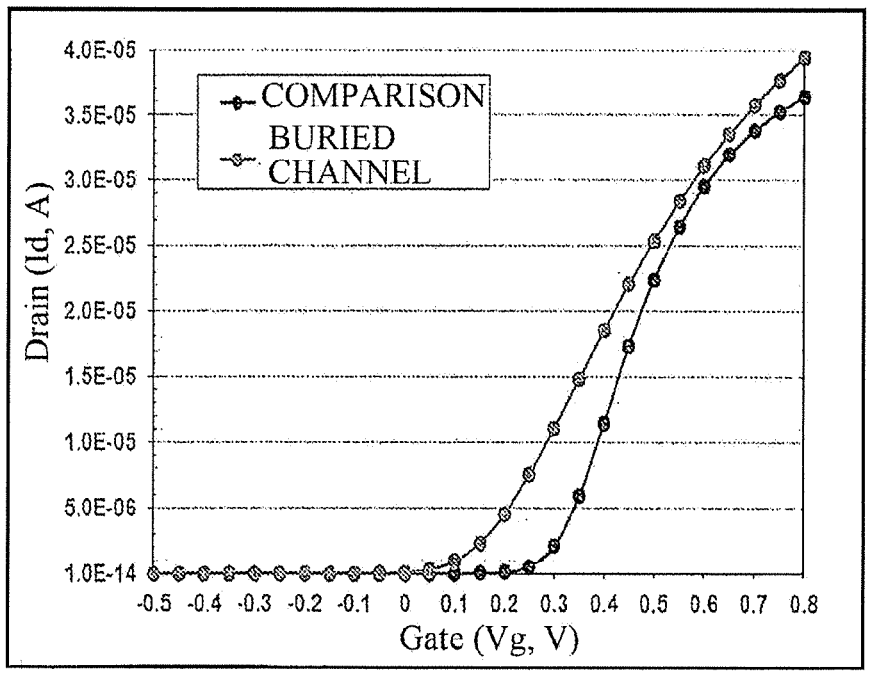
Figure 19C:
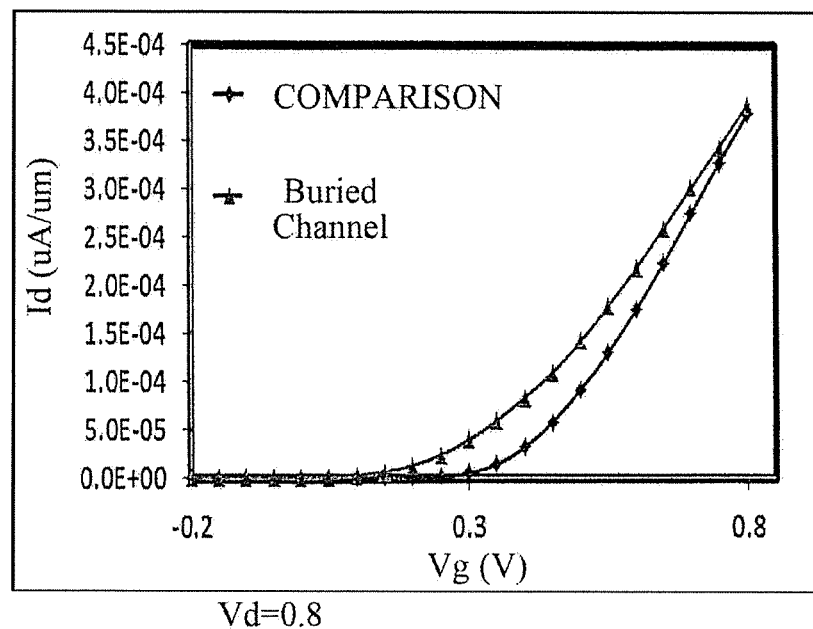
Figure 19D:
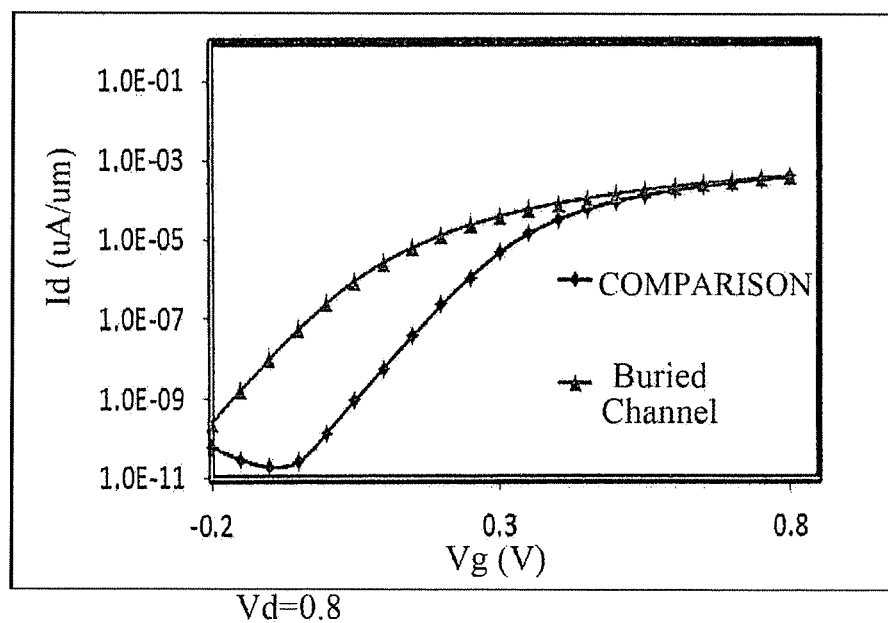

The Gilbert-cell mixer 50 may be incorporated into an apparatus 52 including operational amplifiers, analog-to-digital converters (ADC), digital-to-analog converters (DAC), RF synthesizers, and processors, as shown in FIG. 18. The apparatus in FIG. 18 is an RF full circuit block including a mixer, local area network (LAN), phase locked loop (PLL), voltage control oscillator (VCO), and ADC. In certain embodiments, all transistors in the apparatus are buried-channel FinFET transistors.

Figure 20:
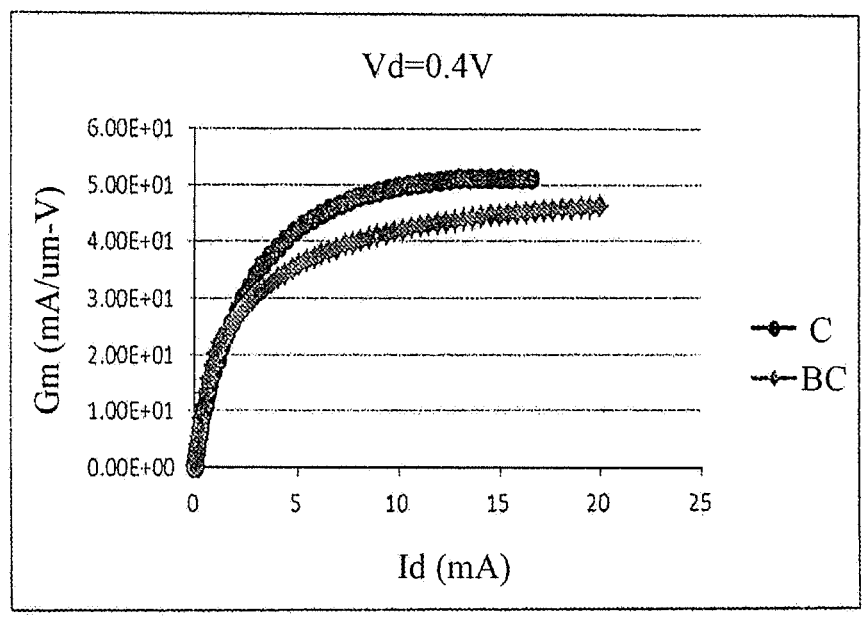
FIG. 20 is a graph illustrating the linearity of a device including a FinFET according to the disclosure.

FinFET devices with a buried-channel implant can provide up to a 10 times reduction in flicker noise and reduced power consumption of up to 40% over bulk CMOS devices. The use of buried-channel FinFET transistors according to the present disclosure in a Gilbert-cell mixer can provide improved mixer linearity with up to 10 times less flicker noise. Gilbert-cell mixers using the disclosed buried-channel FinFET transistors provide a 2-3 times improvement in linearity coupled with increased drain current and power efficiency at a reduced threshold voltage of less than half the threshold voltage of a bulk CMOS device. At the same current level, a mixer having buried-channel FinFET transistors according the present disclosure may improve the linearity by up to 3 dB. At the same linearity, a mixer having buried-channel FinFET transistors may reduce the dc current of the mixer by about 40%. FIGS. 19A, 19B, 19C, and 19D show the gate threshold voltage versus drain current of a mixer including 16 nm gate length FinFETs having a buried channel according the present disclosure in comparison to a standard device having 16 nm gate length FinFETs. A comparison of the linearity of a mixer having 16 nm gate length FinFETs having a buried channel according to the present disclosure (BC) and a standard device (C) having 16 nm gate length FinFETs is illustrated in FIG. 20. In FIGS. 19A-19D and 20, it is found that buried-channel device has a more linear increase in current with increased voltage, whereas the conventional device has an exponential increase in current with increased voltage. Thus, devices according to the present disclosure have increased linearity and low-noise, and non-sensitivity with trap fluctuation.

In one embodiment of the present disclosure, a method for manufacturing a semiconductor device is provided. The method includes forming one or more fins extending in a first direction over a substrate. The one or more fins include a first region along the first direction and second regions on both sides of the first region along the first direction. A dopant is implanted in the first region of the fins but not in the second regions. A gate structure is formed overlying the first region of the fins, and source/drains are formed on the second regions of the fins.

In another embodiment of the disclosure, a semiconductor device is provided including one or more fins extending in a first direction over a substrate. The one or more fins include a first region along the first direction and second regions on either side of the first region along the first direction, and the first region of the fins includes a dopant in a concentration of about $1.5 \times 10^{16}$ to $2.0 \times 10^{20}$ atoms $cm^{-3}$. A gate structure overlies the first region of the fins; and source/drains are formed on the second regions of the fins.

In another embodiment of the disclosure, a Gilbert-cell mixer is provided including a plurality of transistors electrically connected to each other. At least one of the transistors includes one or more fins extending in a first direction over a substrate. The one or more fins include a first region along the first direction and second regions on either side of the first region along the first direction. The first region of the fins includes a dopant in a concentration of about $1.5 \times 10^{16}$ to $2.0 \times 10^{20}$ atoms $cm^{-3}$. A gate structure overlies the first region of the fins and source/drains are formed on the second regions of the fins.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
one or more fins extending in a first direction over a substrate,
wherein the one or more fins include a first region along the first direction and second regions on either side of the first region along the first direction, and the first region of the fins includes a dopant in a concentration of about $1.7 \times 10^{19}$ to $2.0 \times 10^{20}$ atoms $cm^{-3}$, and
the dopant is centered at a region in each fin located at about 15 to 20 nm from a top of the fin and 3 to 7 nm in a fin thickness direction from a sidewall extending along the first direction of each fin;
a gate structure overlies the first region of the one or more fins; and
source/drains are formed on the second regions of the one or more fins.

2. The semiconductor device of claim 1, wherein the dopant is an N-type dopant, selected from the group consisting of P, As, and Sb.

3. The semiconductor device of claim 1, wherein the dopant is a P-type dopant, selected from the group consisting of B, BF$_2$, Al, and Ga.

4. The semiconductor device of claim 1, further comprising a plurality of fins; and
an isolation insulating layer formed between adjacent fins.

5. The semiconductor device of claim 1, having a gate length between source and drain regions of about 7 nm to about 16 nm.

6. The semiconductor device of claim 1, wherein the gate structure comprises a high-k gate dielectric layer and a metal gate electrode.

7. The semiconductor device of claim 1, wherein the source/drain regions are raised source/drain regions.

8. The semiconductor device of claim 1, wherein the source and drains are formed of Si, SiC, SiGe, SiP, or SiCP.

9. The semiconductor device of claim 1, further comprising a pair of side-wall insulating layers disposed on main sides of the gate structure.

10. A Gilbert-cell mixer comprising:
a plurality of transistors electrically connected to each other, wherein at least one of the transistors comprises:
one or more fins extending in a first direction over a substrate,
wherein the one or more fins include a first region along the first direction and second regions on either side of the first region along the first direction, and the first region of the fins includes a dopant centered at a region in each fin located at about 15 to 20 nm from a top of each fin and 3 to 7 nm in a fin thickness direction from a sidewall extending along the first direction of each fin,
wherein a concentration of the dopant is about $1.7\times10^{19}$ to $2.0\times10^{20}$ atoms cm$^{-3}$; a gate structure overlying the first region of the one or more fins; and source/drains formed on the second regions of the one or more fins.

11. The Gilbert-cell mixer of claim 10, wherein the dopant is an N-type dopant selected from the group consisting of P, As, and Sb.

12. The Gilbert-cell mixer of claim 10, wherein the dopant is a P-type dopant selected from the group consisting B, BF$_2$, Al, and Ga.

13. The Gilbert-cell mixer of claim 10, wherein the gate structure comprises a high-k gate dielectric layer and a metal gate electrode.

14. The Gilbert-cell mixer of claim 10, further comprising two inductors, wherein each inductor is electrically connected to a corresponding one of the plurality of transistors.

15. The Gilbert-cell mixer of claim 14, further comprising two capacitors, wherein each capacitor is electrically connected to a corresponding one of the two inductors and the corresponding one of the plurality of transistors.

16. The Gilbert-cell mixer of claim 10, wherein the source and drains are formed of Si, SiC, SiGe, SiP, or SiCP.

17. A buried-channel fin field effect transistor comprising:
one or more fins extending in a first direction over a substrate,
wherein the one or more fins include a channel region along the first direction and source/drain regions on either side of the channel region along the first direction, and the channel region of the one or more fins includes a dopant centered at region in each fin located at about 15 to 20 nm from a top of each fin and 3 to 7 nm in a fin thickness direction from a sidewall extending along the first direction of each fin,
wherein a concentration of the dopant in the first region is about $1.7\times10^{19}$ to $2.0\times10^{20}$ atoms cm$^{-3}$; and
a gate structure overlying the first region of the one or more fins.

18. The buried-channel fin field effect transistor of claim 17, wherein the dopant is an N-type dopant selected from the group consisting of P, As, and Sb.

19. The buried-channel fin field effect transistor of claim 17, wherein the dopant is a P-type dopant selected from the group consisting B, BF$_2$, Al, and Ga.

20. The buried-channel fin field transistor of claim 17, wherein the gate structure comprises a high-k gate dielectric layer and a metal gate electrode.

* * * * *